(12) United States Patent
Koo et al.

(10) Patent No.: US 8,878,593 B2
(45) Date of Patent: Nov. 4, 2014

(54) SWITCH CONTROL CIRCUIT AND POWER SUPPLY DEVICE INCLUDING THE SAME

(71) Applicant: Fairchild Korea Semiconductor Ltd., Bucheon (KR)

(72) Inventors: Gwan-Bon Koo, Bucheon-si (KR); Jin-Tae Kim, Seoul (KR); Won-Seok Lim, New Taipei (TW)

(73) Assignee: Fairchild Korea Semiconductor Ltd. (KR)

( * ) Notice: Subject to any disclaimer, the term of this patent is extended or adjusted under 35 U.S.C. 154(b) by 0 days.

(21) Appl. No.: 14/063,282

(22) Filed: Oct. 25, 2013

(65) Prior Publication Data
US 2014/0118054 A1 May 1, 2014

Related U.S. Application Data

(60) Provisional application No. 61/718,886, filed on Oct. 26, 2012.

(30) Foreign Application Priority Data

Oct. 10, 2013 (KR) .......................... 10-2013-0120824

(51) Int. Cl.
*H03K 17/687* (2006.01)
*H02M 3/335* (2006.01)
*H03K 17/081* (2006.01)

(52) U.S. Cl.
CPC ............................... *H03K 17/08104* (2013.01)
USPC ....................... 327/427; 363/21.04; 363/21.17

(58) Field of Classification Search
USPC .......................................................... 327/427
See application file for complete search history.

(56) References Cited

U.S. PATENT DOCUMENTS

| | | | | |
|---|---|---|---|---|
| 5,341,068 A | * | 8/1994 | Nerone | 315/219 |
| 5,406,177 A | * | 4/1995 | Nerone | 315/307 |
| 5,499,184 A | * | 3/1996 | Squibb | 363/100 |
| 5,671,131 A | * | 9/1997 | Brown | 363/49 |
| 2010/0156314 A1 | * | 6/2010 | Wang et al. | 315/294 |
| 2014/0003104 A1 | * | 1/2014 | Greenfeld | 363/84 |
| 2014/0062620 A1 | * | 3/2014 | Sun et al. | 333/205 |

* cited by examiner

*Primary Examiner* — Ryan Jager
(74) *Attorney, Agent, or Firm* — Grossman Tucker Perreault & Pfleger PLLC

(57) ABSTRACT

The present invention relates to a switch control circuit that controls a switching operation of a power switch circuit that includes cascode-coupled first and second transistors. A switch control circuit includes a first zener diode coupled between a gate of the first transistor and a first end of a capacitor supplying a power voltage and a second zener diode coupled to a gate and a source of the first transistor, and a first resistor coupled between the first zener diode and the second zener diode.

20 Claims, 3 Drawing Sheets

SWITCH CONTROL CIRCUIT AND POWER SUPPLY DEVICE INCLUDING THE SAME

CROSS-REFERENCE TO RELATED APPLICATION

This application claims priority to and the benefit of U.S. Patent Application No. 61/718,886 filed in the USPTO on Oct. 26, 2012, and the priority and benefit of Korean Patent Application No. 10-2013-0120824 filed in the Korean Intellectual Property Office on Oct. 10, 2013, the entire contents of which are incorporated herein by reference.

BACKGROUND (a) Field

Embodiments relate to a switch control circuit and a power supply including the same. For example, the switch control circuit may be used to control a power switch circuit including two FET circuits connected in series.

(b) Description of the Related Art

A DC input generated by rectifying a three-phase input is a high voltage (e.g., about 800V). A device supplying power to a load with the high DC input is using a structure of a power control switch (hereinafter, a power switch) that is appropriate for the high voltage so as to control power supply.

For example, a power control switch of which two transistors are connected in series (hereinafter, referred to as cascode-connection) for controlling power supply using a high input voltage may be applied to the power switch.

However, when a voltage is not evenly divided to the two cascode-connected transistors, one of the transistors applied with an excessively high voltage may be damaged.

The above information disclosed in this Background section is only for enhancement of understanding of the background of the invention and therefore it may contain information that does not form the prior art that is already known in this country to a person of ordinary skill in the art.

SUMMARY OF THE INVENTION

Embodiments have been made in an effort to provide a switch control circuit controlling a switching operation of a power switch circuit in a high voltage condition, and a power supply.

A switch control circuit according to an exemplary embodiment includes a first zener diode coupled between a gate of a first transistor among cascode-coupled first and second transistors and a first end of a capacitor supplying a power voltage and a second zener diode coupled to a gate of the first transistor and a node between the first transistor and the second transistor. The first zener diode and the second zener diode are electrically coupled.

The switch control circuit further includes a first resistor coupled between the first zener diode and the second zener diode.

The first zener diode includes an anode coupled to the capacitor and a cathode coupled to the first end of the first resistor.

The second zener diode includes a cathode coupled to the gate of the first transistor and an anode coupled to the node.

When the second transistor is turned off, a voltage of the first zener diode, which is a cathode voltage of the first zener diode and a voltage of the second zener diode, which is a cathode voltage of the second zener diode are increased.

When the second transistor is turned off, a voltage of the node is increased to a voltage that is lower by the voltage of the second zener diode than a gate voltage of the first transistor.

When the first zener diode voltage and the second zener diode voltage reach a first threshold voltage which is the sum of the first zener voltage and the power voltage, the first zener diode voltage and the second zener diode voltage are consistently maintained with the first threshold voltage.

After the first zener diode voltage and the second zener diode voltage reach the first threshold voltage, the first transistor is turned off due to an increase of the voltage of the node.

A voltage of the node is decreased after the second transistor is turned off, and when the voltage of the node becomes lower by a second zener voltage than a second zener diode voltage which is a cathode voltage of the second zener diode, the second zener diode is reversely biased and thus the second zener diode voltage starts to decrease.

After the voltage of the node becomes lower than the second zener voltage than the second zener diode voltage, the second zener diode voltage is decreased to a voltage that equals the sum of the voltage of the node and the second zener voltage.

A first zener diode voltage which is a cathode voltage of the first zener diode is decreased based on the second zener diode voltage.

A gate-source voltage of the first transistor becomes higher than a gate-source threshold voltage due to a decrease of the voltage of the node and thus the first transistor is turned on.

A first zener diode voltage which is a cathode voltage of the first zener diode is decreased due to the decrease of the voltage of the node and thus the first zener diode is positive-biased, and an input capacitor of the first transistor is charged by a current supplied to the gate of the firs transistor.

The switch control circuit further includes a second resistor for biasing the first zener diode using an input voltage of a power supply that uses the switch control circuit.

The second resistor is coupled between the input voltage and a cathode of the first zener diode.

A power supply according to another exemplary embodiment includes: a power switch circuit including cascode-coupled first and second transistors; a firs zener diode coupled between a gate of the first transistor and a first end of a capacitor supplying a power voltage; and a second zener diode coupled to the gate of the first transistor and a node between the first transistor and the second transistor. The first zener diode and the second zener diode are electrically coupled.

The power supply further includes a first resistor coupled between the first zener diode and the second zener diode.

The first zener diode includes an anode coupled to the capacitor and a cathode coupled to a first end of the first resistor. The second zener diode includes a cathode coupled to the gate of the first transistor and an anode coupled to the node.

The power supply further includes a second resistor coupled between an input voltage and the cathode of the first zener diode.

According to the exemplary embodiments, a switch control circuit that controls a switching operation of a power switch circuit in a high voltage condition, and a power supply can be provided.

DETAILED DESCRIPTION OF THE EMBODIMENTS

Figure 1:
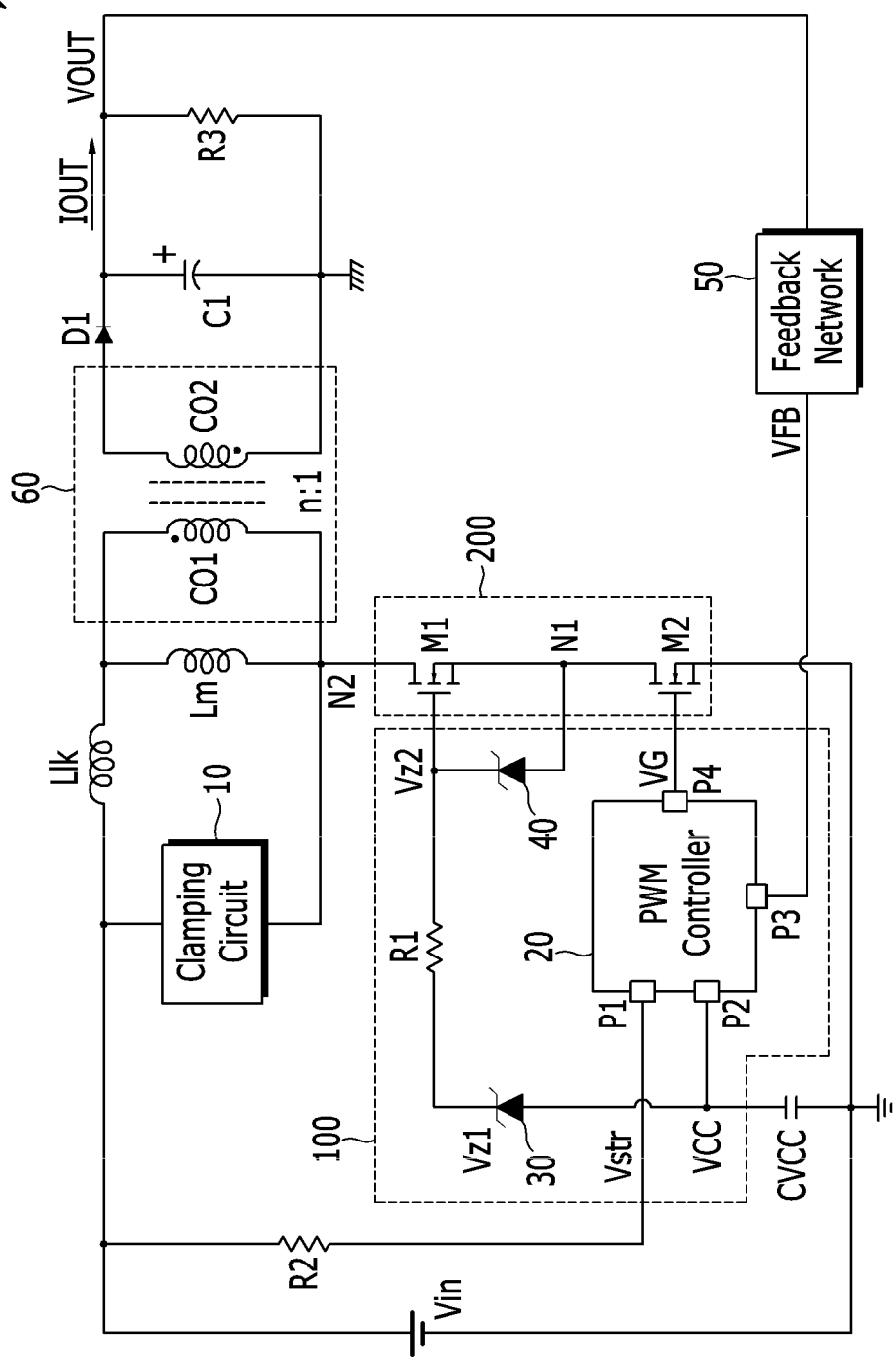
FIG. 1 shows a power supply to which a switch control circuit according to an exemplary embodiment is applied.

In the following detailed description, only certain exemplary embodiments have been shown and described, simply by way of illustration. As those skilled in the art would realize, the described embodiments may be modified in various different ways, all without departing from the spirit or scope. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

Hereinafter, a switch control circuit to control a power switch circuit including two FET circuits connected in series according to exemplary embodiments will be described with reference to FIG. 1 to FIG. 3.

FIG. 1 shows a power supply to which a switch control circuit according to the exemplary embodiment is applied. A power switch circuit of FIG. 1 includes cascode-connected field effect transistors (FETs), and a power supply 1 of FIG. 1 is realized as a flyback converter.

However, the exemplary embodiment is not limited thereto, and when the switch control circuit according to the exemplary embodiment is applicable in a case that a high voltage is generated in a power switch.

The power supply 1 supplies an output current IOUT to a load using an input voltage Vin. In this case, the output voltage VOUT is constantly controlled by a switching operation of a power switch circuit 200.

The power supply 1 includes a transformer 60 formed of a first winding CO1 formed in the primary side and a second winding CO2 formed in the secondary side. A leakage inductor Llk and a magnetizing inductor Lm are formed and connected between the input voltage Vin and the primary side first winding CO1. In further detail, lateral ends of the leakage inductor Llk are connected between the first winding CO1 and the input voltage Vin, and the magnetizing inductor Lm is connected in parallel with the first winding CO1. A ratio of between a turns number n1 of the first winding CO1 and a turns number n2 of the second winding CO2 is n (=n1/n2):1.

The power supply 1 includes the power switch circuit 200, and the power switch circuit 200 includes two CASCODE-connected transistors M1 and M2. In the exemplary embodiment, the transistors M1 and M2 are N channel field effect transistors (FETs). Alternatively, other type of transistors may be applied as the transistors M1 and M2.

A drain of the transistor M1 is connected to a node N2, and a source of the transistor M1 and a drain of the transistor M2 are connected to the node N1. A source of the transistor M2 is connected to a primary side ground.

A clamping circuit 10 is connected between the input voltage Vin and a node N2 and clamps a voltage between the input voltage Vin and the node N2 to a predetermined voltage.

A resistor R2 includes a first end connected to the input voltage Vin and a second end connected to a connection pin P1 of a PWM controller of a switch control circuit 100. The resistor R2 is a start resistor and the connection pin P1 is a pin to which a start voltage Vstr is input.

The start voltage Vstr is used to generate a power voltage VCC for operating the PWM controller 20 in an initial operation stage of the power supply 1. For example, a current generated by the start voltage Vstr in the initial operation state of the power supply 1 charges a capacitor CVCC so that the power voltage VCC is increased to be higher than a predetermined voltage.

An anode of a rectification diode D1 is connected to a first end of the secondary side second winding CO2, and a first end of an output capacitor C1 is connected to a cathode of the rectification diode D1. A second end of the second winding CO2 and a second end of the capacitor C1 are connected to a secondary side ground.

As an example of the load, a resistor R3 is connected to an output end of the power supply 1.

A feedback network 50 generates a feedback voltage VFB according to the output voltage VOUT and transmits the feedback voltage VFB to the switch control circuit 100 in the primary side. For example, the feedback network 50 generates the feedback voltage VFB according to the output voltage VOUT using an opto-coupler (not shown), and the feedback voltage VFB is transmitted to the PWM controller 20 through a connection pin P3.

The switch control circuit 100 controls the switching operation of the power switch circuit 200, and distributes a total voltage between node N2 and the primary side ground to each transistor in the two CASCODE-connected transistors.

When the power switch circuit 200 is turned off from the turn-on state, the switch control circuit 100 turns off the lower transistor M2 and then turns off the upper transistor M1 after a voltage VN1 between drain and source of the lower transistor M2 is increased to a first reference withstanding voltage. In this case, the first withstanding voltage is determined according to a first zener voltage of the first zener diode 30.

When a cathode-anode voltage of the first zener diode 30 reaches the first zener voltage, the first zener diode 30 is reversely biased. Then, the cathode-anode voltage of the first zener diode 30 is maintained with the first zener voltage.

When the power switch circuit 200 is turned on, the first zener diode 30 may be forwardly biased by the power voltage VCC. Then, a discharge current of the capacitor CVCC may flow to a direction of the cathode from the anode.

The switch control circuit 100 generates a gate voltage VG that controls the switching operation of the power switch circuit 200 according to the feedback voltage VFB. The gate voltage VG is supplied to a gate of the transistor M2 through a connection pin P4.

The capacitor CVCC includes a first end connected to the connection pin P2 of the switch control circuit 100 and a second end connected to the primary side ground. The power voltage VCC is generated and stored in CVCC and then supplied to the switch control circuit 100.

An anode of the first zener diode 30 is connected to the first end of the capacitor CVCC and a cathode of the first zener diode 30 is connected to the first end of the resistor R1. The second end of the resistor R1 is connected to the gate of the transistor M1.

An anode of the second zener diode 40 is connected to the node N1 and a cathode of the second zener diode 40 is connected to the gate of the transistor M1. When the second zener diode 40 is reversely biased, a voltage between the node N1 and the transistor M1 is maintained with a second zener voltage.

A cathode voltage of the first zener diode 30 will be referred to as a first zener diode voltage VZ1 and a cathode voltage of the second zener diode 40 will be referred to as a second zener diode VZ2. The second zener diode voltage VZ2 is a gate voltage that controls the switching operation of the transistor M1. The resistor R1 is connected between the cathode of the first zener diode 30 and the cathode of the second zener diode 40 so that the first zener diode voltage VZ1 and the second zener diode voltage VZ2 can be distinguished. However, the first zener diode voltage VZ1 and the second zener diode voltage VZ2 may be substantially equivalent to each other.

The PWM controller 20 receives the feedback VFB, and generates a gate voltage VG that controls the switching operation of the second transistor M2 according to the feedback VFB.

For example, the PWM controller 20 generates an oscillator signal that determines a switching frequency, and generates a high-level gate voltage VG that turns on the second transistor M2 by being synchronized by the oscillator signal. The PWM controller 20 generates a low-level gate signal that turns off the second transistor M2 according to a result of comparison between the oscillator signal and the feedback VFB.

The PWM controller 20 charges the capacitor CVCC connected with the connection pin P2 by using the start voltage Vstr input through the connection pin P1. The power voltage VCC charged in the capacitor CVCC supplies a voltage for operation of the PWM controller 20. A connection pin P4 is connected to the gate of the second transistor M2 and the connection pin P3 is connected to the feedback VFB.

Hereinafter, an operation of the switch control circuit 100 according to the exemplary embodiment will be described with reference to FIG. 2.

Figure 2:
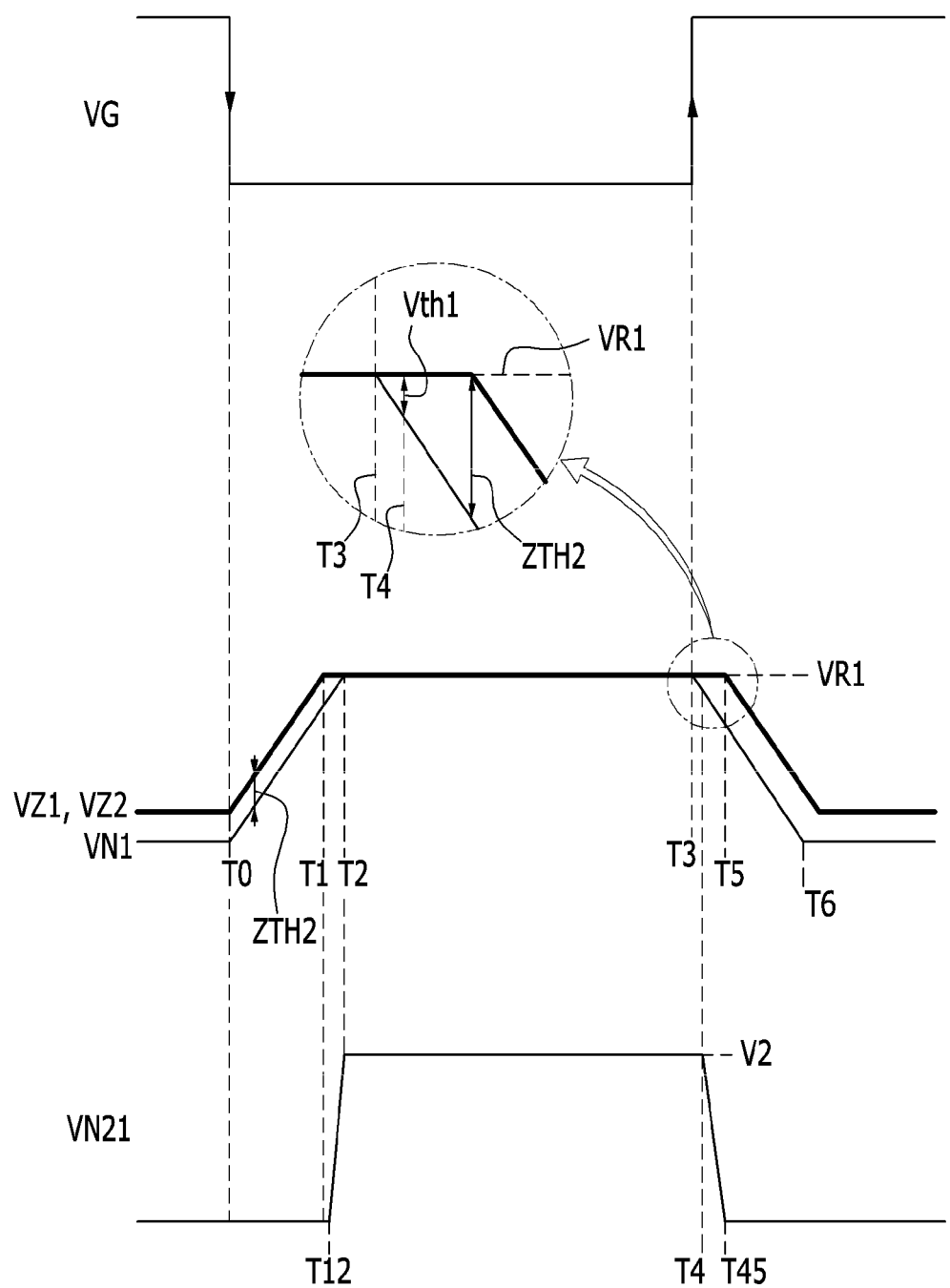
FIG. 2 shows a first zener diode voltage, a second zener diode voltage, and a voltage between both ends of each of transistors.

FIG. 2 shows the first zener diode voltage, the second zener diode voltage, and the voltage between drain and source of each of the transistors.

As shown in FIG. 2, a voltage between the drain and source of the transistor M1 is a voltage VN21 between the node N2 and the node N1, and a voltage between the drain and source of the transistor M2 is a voltage VN1 of the node N1.

First, when the gate voltage VG becomes low level at T0, the transistor M2 is turned off and the voltage VN1 of the node N1 starts to increase. In the turn-on state of the power switch circuit 200, that is, while the transistor M1 and the transistor M2 are in the turn-on state, the first zener diode voltage VZ1 and a second zener diode voltage VZ2 become equivalent to a voltage that is higher by a second zener voltage ZTH2 than the voltage of the node N1. From the time T0, a voltage of the node N2 starts to increase and the transistor M1 is in the turn-on state so that the voltage VN21 is zero voltage.

As the voltage VN1 is increased, the second zener diode voltage VZ2 is increased through the reversely biased second zener diode 40 and the first zener diode voltage VZ1 is also increased along the second zener diode voltage VZ2. When the first zener diode voltage VZ1 reaches a first threshold voltage VR1 at T1, the first zener diode voltage VZ1 is no longer increased and maintained with the first threshold voltage VR1. The first threshold voltage VR1 is the sum of the first zener voltage and the power voltage VCC.

When first zener diode voltage VZ1 is maintained with the first threshold voltage VR1 and the voltage VN1 reaches the first threshold voltage VR1 at T2, the second zener diode voltage VZ2 also becomes the first threshold voltage VR1 and thus maintained with the first threshold voltage VR1. During a period T1 to T2, the transistor M1 is turned off when a gate-source voltage of the transistor M1 becomes lower than a threshold voltage.

For example, the transistor M1 is turned off at T12 and the voltage VN21 starts to increase.

When both of the transistor M1 and the transistor M2 are turned off, a voltage between drain and source of the power switch circuit 200 is the sum (Vin+n*VOUT) of the input voltage Vin and a voltage (n*VOUT) between lateral ends of the first winding CO1.

Thus, the voltage VN21 is increased during a period from a time T12 to the time T2 and thus becomes a voltage V2, and the voltage V2 is Vin+n*VOUT−VR1.

As previously described, since the first threshold voltage VR1 is the sum of the first zener voltage and the power voltage VCC, the voltage between drain and source of the transistor M1 and the voltage between drain and source of the transistor M2 can be controlled by the first zener voltage. Therefore, a difference between voltages divided to the two transistors can be minimized by controlling the first zener voltage. Then, drain and source of a specific transistor can be prevented from being applied with an excessively high voltage.

A period T0 to T2 shown in FIG. 2 is a very short period of time, but the period is sufficiently enlarged for description of the exemplary embodiment in the drawing. That is, from a time that the transistor M2 is turned off by the gate voltage VG is very close to a time that the transistor M1 is turned off are very close to each other.

At T3, the gate voltage VG is increased and thus the transistor M2 is turned on and a drain-source voltage of the transistor M2 is decreased so that the voltage VN1 starts to decrease.

Due to the decrease of the voltage VN1, a voltage difference between the voltage VN1 and the first and second zener diode voltages VZ1 and VZ2 becomes a threshold voltage Vth1 of the transistor M1 at T4, and the transistor M1 begins to turn on from after the time T4. Then, the voltage VN21 starts to decrease from after the time T4. At T45, the voltage VN21 becomes zero voltage.

When the decreasing voltage VN1 becomes a voltage that is lower by the second zener voltage ZTH2 than the second zener diode voltage VZ2 at T5, the second zener diode 40 is reversely biased so that the second zener diode voltage VZ2 is decreased to a voltage (VN1+ZTH2). The first zener diode voltage VZ1 is also decreased along the second zener diode voltage VZ2. When the voltage VN1 becomes zero voltage at T6, the first zener diode voltage VZ1 and the second zener diode voltage VZ2 are consistently maintained with the second zener voltage ZTH2.

When the gate-source voltage of the transistor M1 is higher than the threshold voltage due to the decrease of the voltage VN1, the transistor M1 is turned on. Substantially, the transistor M1 is immediately turned on by the turn-on of the transistor M2.

An input capacitor (not shown) between the gate and the source of the transistor M1 is charged from a time T3 at which the voltage VN1 starts to decrease. When the first zener diode voltage VZ1 is decreased due to the decrease of the voltage VN1 and thus the first zener diode 30 is positive-biased, the input capacitor is charged by a current supplied to the gate of the transistor M1 from the capacitor CVCC.

During a period T3 to T4, the input capacitor is charged and thus the gate-source voltage of the transistor M1 reaches the threshold voltage Vth1, and the input capacitor is charged to the time T5 at which the gate-source voltage of the transistor M1 becomes the second zener voltage ZTH2.

In FIG. 2, a period T3 to T6 are enlarged for description, and the period is substantially a very short period.

The switch control circuit according to the exemplary embodiment may further include a resistor between the input voltage Vin and the cathode of the first zener diode 30 for stably reverse bias of the first zener diode 30.

Figure 3:
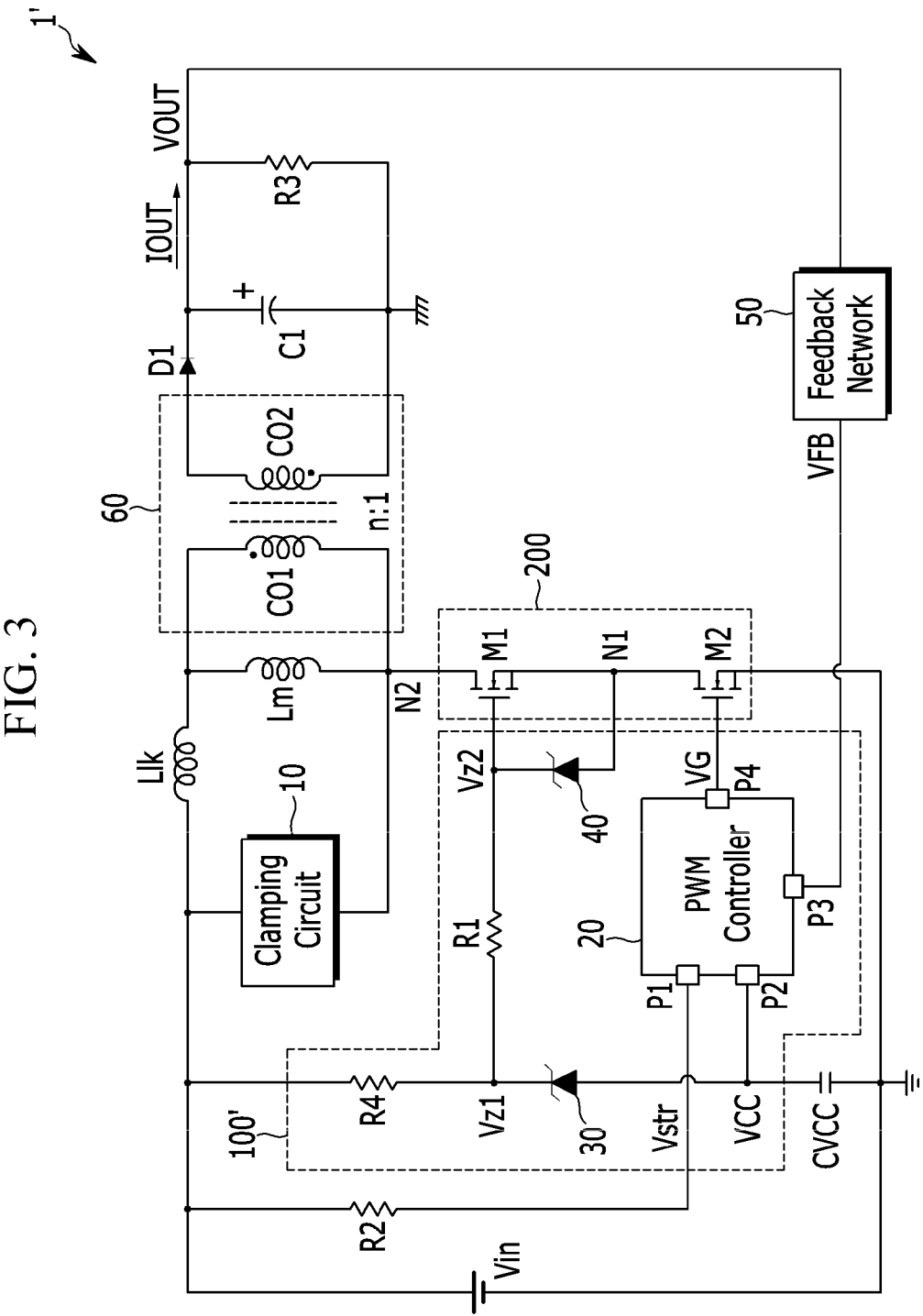
FIG. 3 shows a switch control circuit and a power supply according to another exemplary embodiment.

FIG. 3 shows a switch control circuit and a power supply according to another exemplary embodiment.

A switch control circuit 100' used in a power supply 1' further includes a resistor R4 compared to the exemplary embodiment of FIG. 2. The resistor R4 includes a first end connected to an input voltage Vin and a second end connected to a cathode of a first zener diode 30.

The first zener diode 30 is supplied with a bias current by the input voltage Vin transmitted through the resistor R4. Then, the present exemplary embodiment is more advantageous than the previous exemplary embodiment in maintaining of the first zener diode voltage VZ1 with a consistent threshold voltage. The resistor R4 is designed to be a very high resistor, and thus only a very low current can flow to through the resistor R4.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS power supply 1, capacitor CVCC, transformer 60
rectification diode D1, output capacitor C1, transistor M1 and M2
switch control circuit (100, 100'), power switch circuit 200
PWM controller 20, first zener diode 30
second zener diode 40, feedback network 50
first winding CO1, second winding CO2, leakage inductor Llk
magnetizing inductor Lm, resistor R1, R2, R3, R4
clamping circuit 10

What is claimed is:

1. A switch control circuit comprising:
   a first zener diode coupled between a gate of a first transistor among cascode-coupled first and second transistors and a first end of a capacitor supplying a power voltage; and
   a second zener diode coupled to the gate of the first transistor and a node between the first transistor and the second transistor,
   wherein the first zener diode and the second zener diode are electrically coupled.

2. The switch control circuit of claim 1, further comprising a first resistor coupled between the first zener diode and the second zener diode.

3. The switch control circuit of claim 2, wherein the first zener diode comprises an anode coupled to the first end of the capacitor and a cathode coupled to a first end of the first resistor.

4. The switch control circuit of claim 1, wherein the second zener diode comprises a cathode coupled to the gate of the first transistor and an anode coupled to the node between the first transistor and the second transistor.

5. The switch control circuit of claim 1, wherein the second transistor is turned off, and a voltage of the first zener diode, which is a cathode voltage of the first zener diode, and a voltage of the second zener diode, which is a cathode voltage of the second zener diode, are increased.

6. The switch control circuit of claim 5, wherein the second transistor is turned off, and a voltage of the node between the first transistor and the second transistor is increased to a voltage that is lower by the voltage of the second zener diode than a gate voltage of the first transistor.

7. The switch control circuit of claim 6, wherein when a first zener diode voltage and a second zener diode voltage reach a first threshold voltage, which is the sum of the first zener voltage and the power voltage, the first zener diode voltage and the second zener diode voltage are consistently maintained with the first threshold voltage.

8. The switch control circuit of claim 7, wherein after the first zener diode voltage and the second zener diode voltage reach the first threshold voltage, the first transistor is turned off due to an increase of the voltage of the node between the first transistor and the second transistor.

9. The switch control circuit of claim 1, wherein a voltage of the node between the first transistor and the second transistor is decreased after the second transistor is turned off, and when the voltage of the node between the first transistor and the second transistor becomes lower by a second zener voltage than a second zener diode voltage, which is a cathode voltage of the second zener diode, the second zener diode is reversely biased and thus the second zener diode voltage starts to decrease.

10. The switch control circuit of claim 9, wherein after the voltage of the node between the first transistor and the second transistor becomes lower than by the second zener voltage than the second zener diode voltage, the second zener diode voltage is decreased to a voltage that equals the sum of the voltage of the node between the first transistor and the second transistor and the second zener voltage.

11. The switch control circuit of claim 10, wherein a first zener diode voltage, which is a cathode voltage of the first zener diode, is decreased based on the second zener diode voltage.

12. The switch control circuit of claim 9, wherein a gate-source voltage of the first transistor becomes higher than a gate-source threshold voltage due to a decrease of the voltage of the node between the first transistor and the second transistor, and thus the first transistor is turned on.

13. The switch control circuit of claim 12, wherein a first zener diode voltage, which is a cathode voltage of the first zener diode, is decreased due to the decrease of the voltage of the node between the first transistor and the second transistor and thus the first zener diode is positive-biased, and an input capacitor of the first transistor is charged by a current supplied to the gate of the first transistor.

14. The switch control circuit of claim 1, wherein the switch control circuit further comprises a second resistor for biasing the first zener diode using an input voltage of a power supply that uses the switch control circuit.

15. The switch control circuit of claim 14, wherein the second resistor is coupled between the input voltage and a cathode of the first zener diode.

16. A power supply comprising:
   a power switch circuit including cascode-coupled first and second transistors;
   a first zener diode coupled between a gate of the first transistor and a first end of a capacitor supplying a power voltage; and
   a second zener diode coupled to the gate of the first transistor and a node between the first transistor and the second transistor, wherein the first zener diode and the second zener diode are electrically coupled.

17. The power supply of claim 16, wherein the power supply further comprises a first resistor coupled between the first zener diode and the second zener diode.

18. The power supply of claim 17, wherein the first zener diode comprises an anode coupled to the first end of the capacitor and a cathode coupled to a first end of the first resistor.

19. The power supply of claim 18, wherein the second zener diode comprises a cathode coupled to the gate of the first transistor and an anode coupled to the node between the first transistor and the second transistor.

20. The power supply of claim 16, further comprising a second resistor coupled between an input voltage and the cathode of the first zener diode.

* * * * *